(12) United States Patent
Kim

(10) Patent No.: US 12,013,440 B2
(45) Date of Patent: Jun. 18, 2024

(54) SOC ESTIMATING APPARATUS AND METHOD

(71) Applicant: LG ENERGY SOLUTION, LTD., Seoul (KR)

(72) Inventor: Jae-Gu Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 456 days.

(21) Appl. No.: 17/442,591

(22) PCT Filed: Oct. 5, 2020

(86) PCT No.: PCT/KR2020/013498
§ 371 (c)(1),
(2) Date: Sep. 23, 2021

(87) PCT Pub. No.: WO2021/075771
PCT Pub. Date: Apr. 22, 2021

(65) Prior Publication Data
US 2022/0187382 A1    Jun. 16, 2022

(30) Foreign Application Priority Data

Oct. 18, 2019 (KR) ........................ 10-2019-0130074

(51) Int. Cl.
*G01R 31/3842* (2019.01)
*G01R 31/396* (2019.01)
(Continued)

(52) U.S. Cl.
CPC ....... *G01R 31/3842* (2019.01); *G01R 31/396* (2019.01); *H01M 10/4257* (2013.01);
(Continued)

(58) Field of Classification Search
CPC ............. G01R 31/3842; G01R 31/396; H01M 10/4257; H01M 10/482; H01M 2010/4271; H01M 2220/20; Y02E 60/10
See application file for complete search history.

(56) References Cited

U.S. PATENT DOCUMENTS

2001/0028238 A1* 10/2001 Nakamura ........ H01M 10/4242
320/132
2006/0022676 A1    2/2006 Uesaka et al.
(Continued)

FOREIGN PATENT DOCUMENTS

CN    102062841 A    5/2011
CN    104166102 A    11/2014
(Continued)

OTHER PUBLICATIONS

Office Action, dated Jul. 22, 2023, issued in corresponding CN Application No. 202080032045.0. (Note: JP 2004-260905 A, CN 103635822 A, DE 11 2017 001 422 T5, JP 2010-190818 A, JP 2012-108046 A, JP 2015-230169 A, and KR 10-2019-0040412 A cited therein are already of record).
(Continued)

*Primary Examiner* — Manuel A Rivera Vargas
(74) *Attorney, Agent, or Firm* — Morgan, Lewis & Bockius LLP

(57) ABSTRACT

The present disclosure is directed to providing an SOC estimating apparatus and method, which may accurately estimate OCV and SOC of a battery cell even when a voltage rough graph of the battery cell exhibits a nonlinear rough graph. According to an aspect of the present disclosure, the SOC estimating apparatus has an advantage of estimating the SOC of the battery cell more accurately and more reliably. In addition, the SOC estimating apparatus has an advantage of estimating the final SOC of the battery cell quickly even in an environment where it is difficult to secure
(Continued)

a sufficient rest period, by estimating the second SOC based on voltage information obtained during the charging and discharging interruption time.

12 Claims, 7 Drawing Sheets

(51) Int. Cl.
*H01M 10/42* (2006.01)
*H01M 10/48* (2006.01)
(52) U.S. Cl.
CPC .. *H01M 10/482* (2013.01); *H01M 2010/4271* (2013.01); *H01M 2220/20* (2013.01)

(56) References Cited

U.S. PATENT DOCUMENTS

| | | |
|---|---|---|
| 2008/0065336 A1 | 3/2008 | Seo et al. |
| 2013/0300425 A1 | 11/2013 | Shiraishi et al. |
| 2014/0167656 A1 | 6/2014 | Yamada |
| 2018/0313906 A1 | 11/2018 | Takahashi et al. |
| 2019/0113581 A1 | 4/2019 | Kawamura |
| 2019/0178948 A1 | 6/2019 | Takahashi |
| 2019/0299942 A1* | 10/2019 | Shih ................. B60L 53/80 |
| 2019/0383880 A1* | 12/2019 | Naskali ............ H02J 7/007184 |
| 2021/0055348 A1 | 2/2021 | Kim et al. |

FOREIGN PATENT DOCUMENTS

| | | |
|---|---|---|
| CN | 104515955 A | 4/2015 |
| CN | 106707189 A | 5/2017 |
| CN | 107064808 A | 8/2017 |
| CN | 107422269 A | 12/2017 |
| CN | 108872866 A | 11/2018 |
| DE | 11 2017 001 422 T5 | 11/2018 |
| JP | 2004-260905 A | 9/2004 |
| JP | 4032934 B2 | 1/2008 |
| JP | 2008-116367 A | 5/2008 |
| JP | 2008-145349 A | 6/2008 |
| JP | 2010-190818 A | 9/2010 |
| JP | 2012-108046 A | 6/2012 |
| JP | 2013-240153 A | 11/2013 |
| JP | 2014-25738 A | 2/2014 |
| JP | 2014-199238 A | 10/2014 |
| JP | 2015-230169 A | 12/2015 |
| JP | 2018-151175 A | 9/2018 |
| JP | 2019-74501 A | 5/2019 |
| KR | 10-0805116 B1 | 2/2008 |
| KR | 10-2015-0005073 A | 1/2015 |
| KR | 10-1543263 B1 | 8/2015 |
| KR | 10-2019-0040412 A | 4/2019 |
| KR | 10-2019356 B1 | 9/2019 |
| WO | 2013/031559 A1 | 3/2013 |
| WO | 2017/056732 A1 | 4/2017 |

OTHER PUBLICATIONS

International Search Report issued in corresponding International Patent Application No. PCT/KR2020/013498, dated Jan. 26, 2021.
Office Action dated Jan. 31, 2023, issued in corresponding Japanese Patent Application No. 2021-549504.
Extended European Search Report dated Jul. 5, 2022 issued by the European Patent Office in corresponding European Patent Application No. 20877787.0.
Office Action issued by the Japanese Patent Office dated Sep. 6, 2022 in corresponding Japanese Patent Application No. 2021-549504.

* cited by examiner

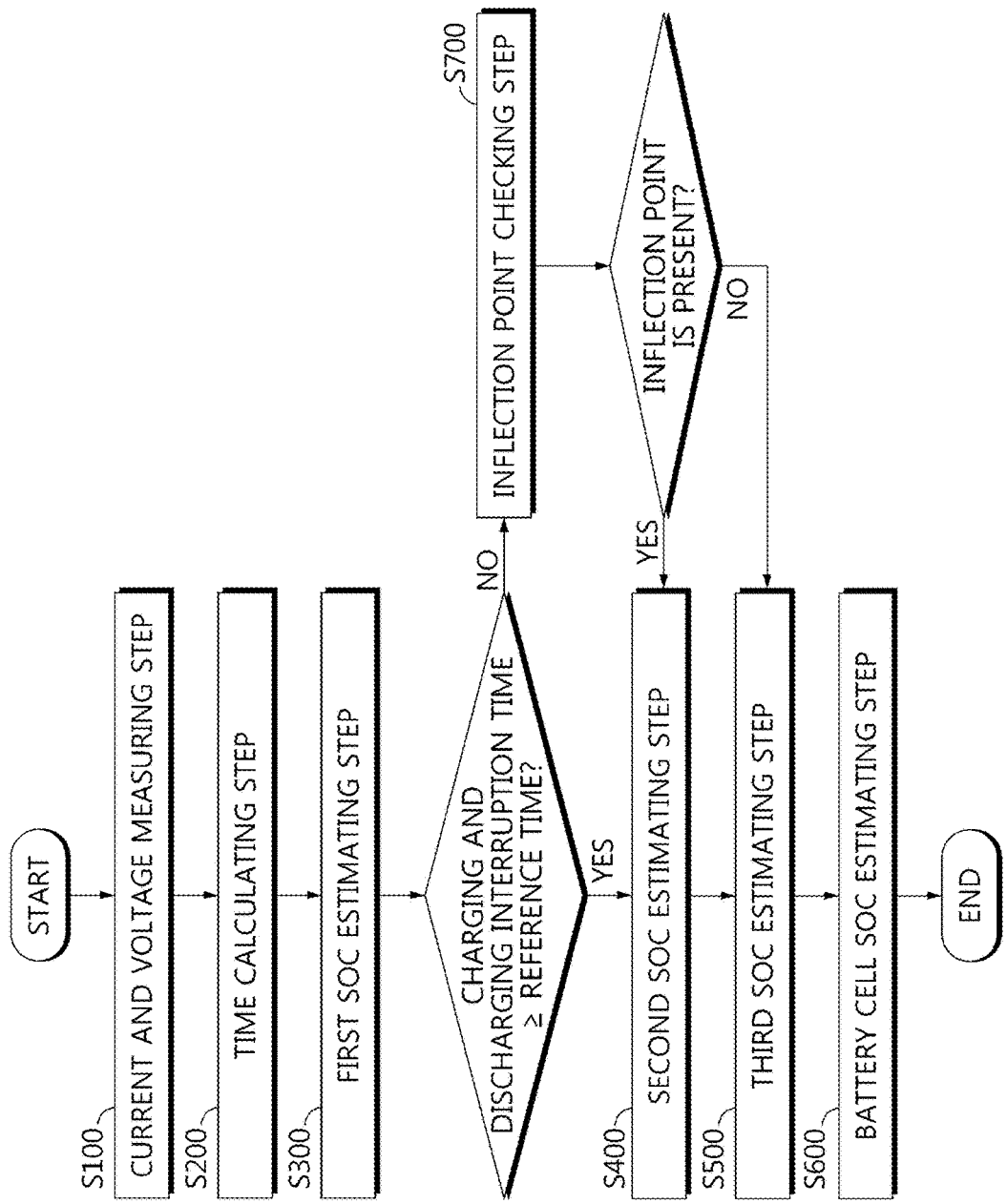

SOC ESTIMATING APPARATUS AND METHOD

TECHNICAL FIELD

The present application claims priority to Korean Patent Application No. 10-2019-0130074 filed on Oct. 18, 2019 in the Republic of Korea, the disclosures of which are incorporated herein by reference.

The present disclosure relates to a SOC estimating apparatus and method, and more particularly, to a SOC estimating apparatus and method for accurately estimating a SOC of a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

In order to use the battery efficiently, it is necessary to accurately estimate a SOC (State Of Charge) of the battery so that the current capacity of the battery may be determined. However, since the SOC of the battery cannot be measured directly, several technologies have been developed to more accurately estimate the SOC.

In particular, a technique for estimating an OCV (Open Circuit Voltage) of a battery by linearly analyzing a first voltage and a second voltage measured during a period in which charging and discharging do not occur has been developed (Patent Literature 1).

However, the OCV estimation according to the linear equation used in Patent Literature 1 may be applied only when the voltage of the battery has a linear rough graph, and cannot be applied when the voltage of the battery has a nonlinear rough graph.

For example, after a large current rapidly flows through the battery for a short period of time, the voltage of the battery exhibits a non-linear rough graph. In this case, if Patent Literature 1 is applied, the OCV may be estimated incorrectly. Further, according to Patent Literature 1, since the SOC of the battery may be erroneously estimated due to the incorrectly estimated OCV, there is a problem in that it is impossible to accurately diagnose or determine the state of the battery.

(Patent Literature 1) KR 10-0805116 B1

DISCLOSURE

Technical Problem

The present disclosure is designed to solve the problems of the related art, and therefore the present disclosure is directed to providing an SOC estimating apparatus and method, which may accurately estimate OCV and SOC of a battery cell even when a voltage rough graph of the battery cell exhibits a nonlinear rough graph.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a SOC estimating apparatus, comprising: a measuring unit configured to measure a current and voltage of a battery cell and output the measured current information and the measured voltage information; and a control unit configured to receive the current information and the voltage information from the measuring unit, calculate a charging and discharging time during which the battery cell is charged or discharged and a charging and discharging interruption time during which the charging and discharging is interrupted, estimate a first SOC of the battery cell according to the current information during the charging and discharging time, determine whether or not to estimate a second SOC of the battery cell according to the voltage information based on a comparison result of the charging and discharging interruption time and a preset reference time, estimate a third SOC by performing a weighted summation to the first SOC and the second SOC based on the charging and discharging interruption time when the second SOC is estimated, and determine the estimated third SOC as the SOC of the battery cell.

When the charging and discharging interruption time is equal to or greater than the reference time, the control unit may be configured to estimate the second SOC based on a plurality of voltage information received during the charging and discharging interruption time.

When the charging and discharging interruption time is smaller than the reference time, the control unit may be configured to check whether a voltage inflection point is present in the plurality of voltage information received during the charging and discharging interruption time and estimate the second SOC only when the voltage inflection point is checked.

The control unit may be configured to set the reference time in advance so that a time at which polarization directions of a short-term polarization component and a long-term polarization component of the battery cell become different from each other is included therein.

The control unit may be configured to estimate an OCV of the battery cell from the plurality of voltage information received during the charging and discharging interruption time by using a function optimization technique.

The control unit may be configured to estimate a second SOC corresponding to the estimated OCV, based on a preset look-up table.

The control unit may be configured to set a first weight and a second weight according to the charging and discharging interruption time, add the set first weight and the set second weight to the first SOC and the second SOC, respectively, and estimate the third SOC by summing the weighted first SOC and the weighted second SOC.

The control unit may be configured to set the charging and discharging interruption time and the first weight to be inversely proportional to each other and set the charging and discharging interruption time and the second weight to be proportional to each other.

A battery pack according to another aspect of the present disclosure may comprise the SOC estimating apparatus according to an aspect of the present disclosure.

A vehicle according to still another aspect of the present disclosure may comprise the SOC estimating apparatus according to an aspect of the present disclosure.

A SOC estimating method according to still another aspect of the present disclosure comprises: a current and voltage measuring step of measuring a current and voltage of a battery cell to obtain current information and voltage information; a time calculating step of calculating a charging and discharging time during which the battery cell is charged or discharged and a charging and discharging interruption time during which the charging and discharging is interrupted; a first SOC estimating step of estimating a first SOC of the battery cell according to the current information during the charging and discharging time; a second SOC estimating step of estimating a second SOC of the battery cell according to the voltage information based on a comparison result of the charging and discharging interruption time and a preset reference time; a third SOC estimating step of estimating a third SOC by performing a weighted summation to the first SOC and the second SOC based on the charging and discharging interruption time; and a battery cell SOC estimating step of determining the estimated third SOC as the SOC of the battery cell.

The SOC estimating method according to still another aspect of the present disclosure may further comprise: after the first SOC estimating step, an inflection point checking step of checking whether a voltage inflection point is present in a plurality of voltage information received during the charging and discharging interruption time, when the charging and discharging interruption time is smaller than the reference time.

The second SOC estimating step may estimate the second SOC only when the charging and discharging interruption time is equal to or greater than the reference time or the voltage inflection point is checked in the inflection point checking step.

Advantageous Effects

According to one aspect of the present disclosure, the SOC estimating apparatus has an advantage of estimating the SOC of the battery cell more accurately and more reliably.

In addition, the SOC estimating apparatus has an advantage of estimating the final SOC of the battery cell quickly even in an environment where it is difficult to secure a sufficient rest period, by estimating the second SOC based on voltage information obtained during the charging and discharging interruption time.

The effects of the present disclosure are not limited to the above, and other effects not mentioned herein will be clearly understood by those skilled in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 11 is a diagram schematically showing a SOC estimating method according to still another embodiment of the present disclosure.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 1:
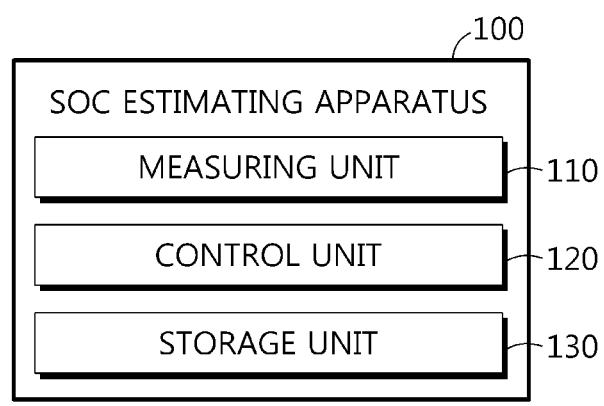
FIG. 1 is a diagram schematically showing a SOC estimating apparatus according to an embodiment of the present disclosure.
Figure 2:
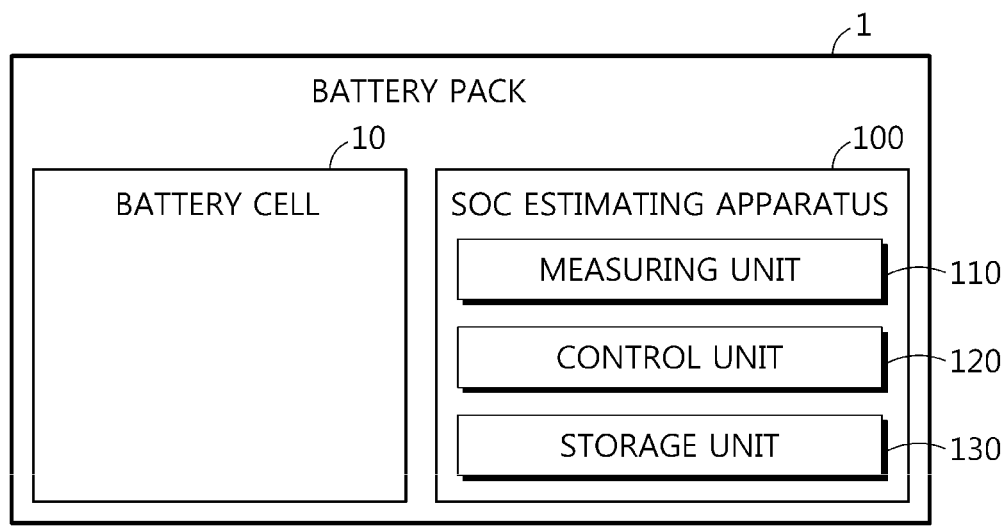
FIG. 2 is a diagram schematically showing a battery pack including the SOC estimating apparatus according to an embodiment of the present disclosure.
Figure 3:
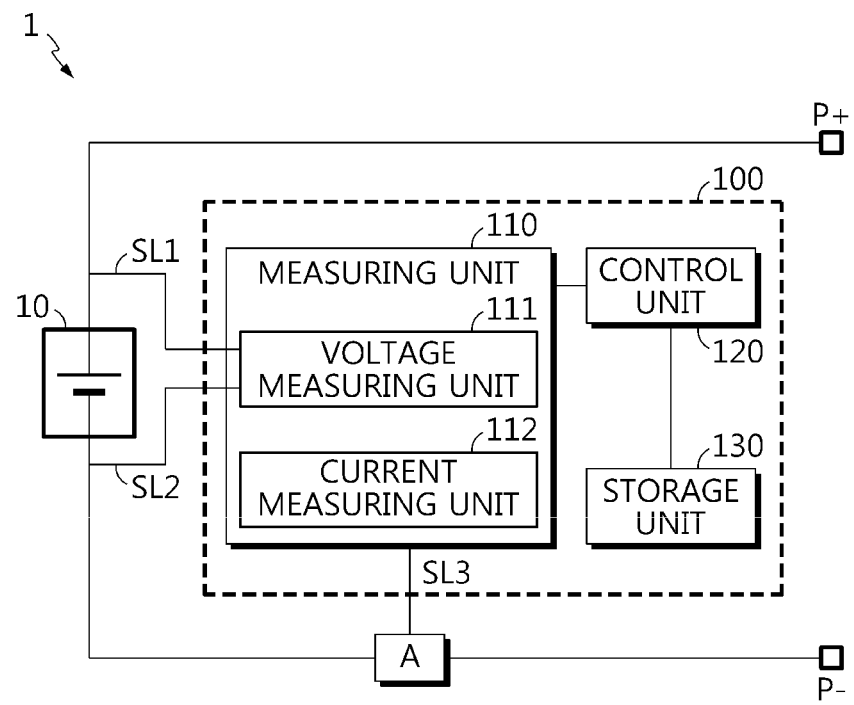
FIG. 3 is a diagram showing an exemplary configuration of the battery pack including the SOC estimating apparatus according to an embodiment of the present disclosure.

FIG. 1 is a diagram schematically showing a SOC estimating apparatus 100 according to an embodiment of the present disclosure. FIG. 2 is a diagram schematically showing a battery pack 1 including the SOC estimating apparatus 100 according to an embodiment of the present disclosure. FIG. 3 is a diagram showing an exemplary configuration of the battery pack 1 including the SOC estimating apparatus 100 according to an embodiment of the present disclosure.

Referring to FIGS. 2 and 3, the battery pack 1 may include a battery cell 10 and a SOC estimating apparatus 100.

The battery cell 10 includes a negative electrode terminal and a positive electrode terminal, and refers to one independent cell that is physically separable. For example, one pouch-type lithium polymer cell may be regarded as the battery cell 10.

In addition, although the battery pack 1 including one battery cell 10 is shown in FIGS. 2 and 3, the battery pack 1 may include a battery module in which one or more battery cells 10 are connected in series and/or in parallel.

Referring to FIG. 1, the SOC estimating apparatus 100 according to an embodiment of the present disclosure may include a measuring unit 110 and a control unit 120.

The measuring unit 110 may be configured to measure a current and voltage of the battery cell 10.

The measuring unit 110 may measure a voltage of the positive electrode terminal of the battery cell 10 and a voltage of the negative electrode terminal, and measure the voltage of the battery cell 10 by calculating a difference between the measured voltages at both terminals.

For example, in the embodiment of FIG. 3, the measuring unit 110 may include a voltage measuring unit 111 that measures the voltage of the battery cell 10. The voltage measuring unit 111 may measure a positive electrode voltage of the battery cell 10 through a first sensing line SL1 and measure a negative electrode voltage of the battery cell 10 through a second sensing line SL2. In addition, the voltage measuring unit 111 may measure the voltage of the battery cell 10 by calculating a difference between the measured positive electrode voltage and the measured negative electrode voltage of the battery cell 10.

In addition, the measuring unit 110 may measure the current of the battery cell 10 by measuring a current flowing in a main path in which the battery cell 10 is disposed. That is, the measuring unit 110 may measure a charging current and/or a discharging current of the battery cell 10.

For example, in the embodiment of FIG. 3, the measuring unit 110 may include a current measuring unit 112 that measures the current of the battery cell 10. In addition, an ampere meter for measuring the current may be disposed in the main path in which battery cell 10 is disposed. Alternatively, a sense resistor for measuring the current may be disposed in the main path. Here, the main path may be a main charging and discharging path that connects a positive electrode terminal (P+) of the battery pack 1 and a negative electrode terminal (P−) of the battery pack 1. That is, the main path may be a path to which the positive electrode terminal (P+) of the battery pack 1, the battery cell 10, and the negative electrode terminal (P−) of the battery pack 1 are connected.

The current measuring unit 112 may be connected to the ampere meter and/or the sense resistor through a third sensing line SL3 to measure the current flowing through the main path. The current measuring unit 112 may measure the current of the battery cell 10 based on the current measured using the third sensing line SL3.

The measuring unit 110 may be configured to output the measured current information and the measured voltage information.

Specifically, the measuring unit 110 may convert the measured current information and the measured voltage information into a digital signal that may be output. In addition, the measuring unit 110 may output the measured current information and the measured voltage information by outputting the converted digital signal.

The control unit 120 may be configured to receive the current information and the voltage information from the measuring unit 110.

Referring to the embodiment of FIG. 3, the control unit 120 may be connected to the measuring unit 110. For example, the control unit 120 may be electrically connected to the measuring unit 110 through a wired line. As another example, the control unit 120 may be connected to the measuring unit 110 through wireless communication. The control unit 120 may obtain the current information and the voltage information measured by the measuring unit 110 by receiving the digital signal output from the measuring unit 110 and reading the received digital signal.

The control unit 120 may be configured to calculate a charging and discharging time during which the battery cell 10 is charged or discharged, and a charging and discharging interruption time during which the charging or discharging is interrupted.

For example, the control unit 120 may determine whether the battery cell 10 is charged or discharged based on the obtained current information.

If the current information obtained by the control unit 120 corresponds to current information when the battery cell 10 is being charged or discharged, the control unit 120 may calculate a time during which the charging or discharging continues.

Conversely, if the current information obtained by the control unit 120 corresponds to current information when the battery cell 10 is not being charged and discharged, the control unit 120 may calculate the charging and discharging interruption time of the battery cell 10. That is, the control unit 120 may calculate an idle time of the battery cell 10 based on the current information received from the measuring unit 110.

As another example, in the embodiment of FIG. 3, if a load is connected to the positive electrode terminal (P+) and the negative electrode terminal (P−) of the battery pack 1, the control unit 120 may also calculate the charging and discharging time and the charging and discharging interruption time by determining whether the battery pack 1 is electrically connected to the load.

The control unit 120 may be configured to estimate a first SOC of the battery cell 10 according to the current information during the charging and discharging time. Specifically, if the battery cell 10 is being charged or discharged, the control unit 120 may be configured to estimate the first SOC by adding a charging current amount or a discharging current amount. Here, the control unit 120 may estimate the first SOC of the battery cell 10 using a commonly used ampere counting method.

Also, the control unit 120 may be configured to determine whether to estimate a second SOC of the battery cell 10 according to the received voltage information based on a comparison result of the charging and discharging interruption time and a preset reference time.

Here, the preset reference time may be a time set to have a predetermined size. That is, the size of the reference time may be set in advance. For example, the reference time may be set within 300 to 500 seconds. Preferably, the reference time may be set to 300 seconds.

For example, the reference time may be preset and stored in an internal memory provided to the control unit 120.

As another example, referring to FIGS. 1 to 3, the SOC estimating apparatus 100 may further include a storage unit 130 for storing the reference time. Here, the storage unit 130 may store programs, data and the like required for the control unit 120 to estimate the SOC of the battery cell 10. That is, the storage unit 130 may store data necessary for operation and function of each component of the SOC estimating apparatus 100, data generated in the process of performing the operation or function, or the like. The storage unit 130 is not particularly limited in its kind as long as it is a known information storage means that can record, erase, update and read data. As an example, the information storage means may include RAM, flash memory, ROM, EEPROM, registers, and the like. In addition, the storage unit 130 may store program codes in which processes executable by the control unit 120 are defined.

First, the control unit 120 may compare the size of the charging and discharging interruption time with the size of the reference time. That is, the control unit 120 may calculate a charging and discharging interruption time from a time when the charging or discharging of the battery cell 10 is interrupted to a time when the charging or discharging of the battery cell 10 is restarted. In addition, the control unit 120 may determine whether to estimate the second SOC of the battery cell 10 based on the comparison result of the size of the calculated charging and discharging interruption time and the size of the reference time.

If it is determined that estimating the second SOC is necessary, the control unit 120 may estimate the second SOC of the battery cell 10 based on the voltage information of the battery cell 10 obtained during the charging and discharging interruption time.

In order to estimate the second SOC, the control unit 120 may estimate an OCV (Open Circuit Voltage) of the battery cell 10 by synthesizing the voltage information of the battery cell 10 obtained during the charging and discharging interruption time. In addition, the control unit 120 may estimate the second SOC of the battery cell 10 corresponding to the estimated OCV by referring to a pre-stored OCV-SOC look-up table. Here, the OCV-SOC look-up table may be a look-up table in which OCV and SOC corresponding to each other are mapped and stored. In addition, the OCV-SOC look-up table may be stored in advance in the internal memory provided to the control unit 120 or in the storage unit 130.

If the second SOC is estimated, the control unit 120 may be configured to estimate a third SOC by performing a weighted summation to the first SOC and the second SOC based on the charging and discharging interruption time.

Specifically, the first SOC may be an SOC estimated based on the current of the battery cell 10 measured during the charging and discharging time, and the second SOC may be a SOC estimated based on the voltage of the battery cell 10 measured during the charging and discharging interruption time.

The control unit 120 may estimate the third SOC according to the charging and discharging interruption time by performing the weighted summation to the first SOC and the second SOC.

For example, as the charging and discharging interruption time is shorter, a weight of the estimated first SOC in the estimated third estimation state may be increased. Conversely, as the charging and discharging interruption time is longer, a weight of the estimated second SOC in the estimated third estimation state may be increased. Finally, the control unit 120 may be configured to determine the estimated third SOC as the SOC of the battery cell 10.

That is, when determining a final SOC of battery cell 10, the control unit 120 may estimate the SOC of the battery cell 10 by comprehensively considering the current information during the charging and discharging time and the voltage information during the charging and discharging interruption time.

Therefore, the SOC estimating apparatus 100 according to an embodiment of the present disclosure has an advantage of estimating the SOC of the battery cell 10 more accurately and more reliably. In addition, since the SOC estimating apparatus 100 estimates the second SOC based on the voltage information obtained during the charging and discharging interruption time, it has an advantage of quickly estimating the final SOC of the battery cell 10 even in an environment where it is difficult to secure a sufficient rest period.

Meanwhile, the control unit 120 provided to the SOC estimating apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 130 and may be connected to the control unit 120 by various well-known means.

Hereinafter, an embodiment in which the control unit 120 estimates the third SOC according to the size of the charging and discharging interruption time will be described with reference to FIGS. 4 and 5. For convenience of explanation, an example of a situation in which the battery cell 10 is discharged is illustrated in FIGS. 4 and 5, and it is assumed that the battery cell 10 is not charged during the time shown in FIGS. 4 and 5.

Figure 4:
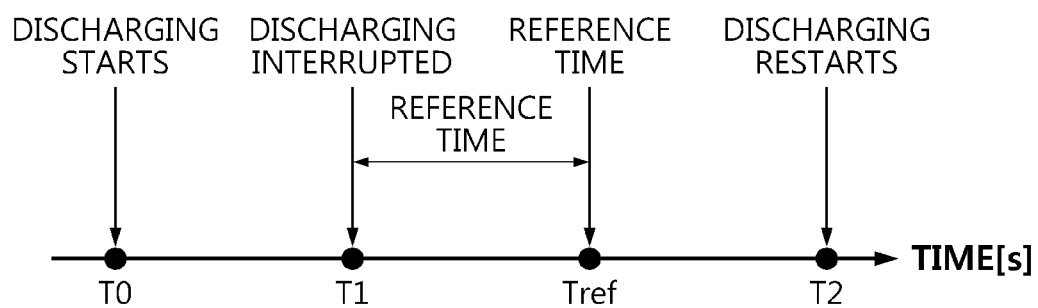
FIG. 4 is a diagram schematically showing a first embodiment in which a charging and discharging interruption time has a greater size than a reference time.
Figure 5:
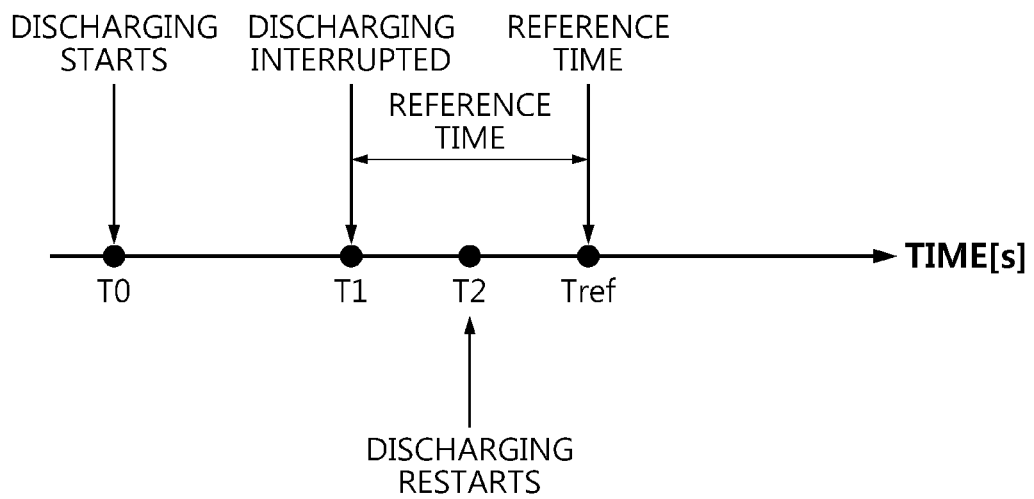
FIG. 5 is a diagram schematically showing a second embodiment in which the charging and discharging interruption time has a smaller size than the reference time.

First, FIG. 4 is a diagram schematically showing a first embodiment in which a charging and discharging interruption time has a greater size than a reference time. Specifically, FIG. 4 is a diagram showing an exemplary time table for the first embodiment.

Referring to FIG. 4, discharging of the battery cell 10 may start at time T0 and the discharging of the battery cell 10 may be interrupted at time T1. In addition, the discharging of the battery cell 10 may be restarted at time T2. In addition, the time Tref may be a time elapsed by a reference time from the time T1 at which discharging of the battery cell 10 is interrupted. That is, an interval between the time T0 and the time T1 may be the charging and discharging time, and an interval between the time T1 and the time T2 may be the charging and discharging interruption time.

For example, a vehicle equipped with the battery cell 10 may be turned on at the time T0 and turned off at the time T1. After that, the vehicle may be turned on again at the time T2.

In the embodiment of FIG. 4, the measuring unit 110 may measure the current of the battery cell 10 from the time T0 at which discharging of the battery cell 10 starts to the time T1 at which discharging is interrupted. In addition, the control unit 120 may estimate the first SOC based on the current information of the battery cell 10 measured by the measuring unit 110. In this case, the control unit 120 may estimate the first SOC by integrating the current information measured from the time T0 to the time T1.

Of course, the measuring unit 110 may measure the current of the battery cell 10 from the time T1 to the time T2 at which the discharging of the battery cell 10 is interrupted. However, since no current flows through the main path when the discharging is interrupted, the first SOC estimated based on the current information measured from the time T0 to the time T1 and the first SOC estimated based on the current information measured from the time T0 to the time T2 do not show a significant difference. Therefore, hereinafter, for convenience of explanation, it will be described that the measuring unit 110 measures the current of the battery cell 10 only while the battery cell 10 is being discharged.

In addition, the control unit 120 may be configured to estimate the second SOC based on a plurality of voltage information received during the charging and discharging interruption time, if the charging and discharging interruption time is equal to or greater than the reference time.

First, the control unit 120 may calculate the charging and discharging interruption time by calculating a difference between the time T1 and the time T2. In addition, if the size of the charging and discharging interruption time is greater than the size of the reference time, the control unit 120 may estimate the second SOC.

For example, in the embodiment of FIG. 4, since the difference between the time T1 and the time T2 is greater than the reference time, the control unit 120 may estimate the second SOC by synthesizing the plurality of voltage information measured from the time T1 to the time T2 by the measuring unit 110. That is, if the time T2 is later than the time Tref, the control unit 120 may estimate the second SOC.

In addition, the control unit 120 may estimate the third SOC based on the estimated first SOC and the estimated second SOC. Accordingly, since the SOC of the battery cell 10 is estimated by considering both the first SOC and the second SOC, the accuracy and reliability of the estimated SOC of the battery cell 10 may be improved.

FIG. 5 is a diagram schematically showing a second embodiment in which the charging and discharging interruption time has a smaller size than the reference time. Specifically, FIG. 5 is a diagram showing an exemplary time table for the second embodiment.

Similar to FIG. 4, in the embodiment of FIG. 5, the discharging of the battery cell 10 may start at the time T0 and the discharging of the battery cell 10 may be interrupted at the time T1. In addition, at the time T2, the discharging of the battery cell 10 may be restarted. In addition, the time Tref may be a time elapsed by a reference time from the time T1 at which the discharging of the battery cell 10 is interrupted. That is, the interval between the time T0 and the time T1 may be the charging and discharging time, and the interval between the T1 and the time T2 may be the charging and discharging interruption time.

The control unit 120 may estimate the first SOC of the battery cell 10 based on the current information measured from the time T0 to the time T1 by the measuring unit 110. After that, the control unit 120 may calculate the charging and discharging interruption time by calculating a difference between the time T1 and the time T2.

Preferably, if the charging and discharging interruption time is smaller than the reference time, the control unit 120 may be configured to check whether a voltage inflection point is present among the plurality of voltage information received during the charging and discharging interruption time and estimate the second SOC only when the voltage inflection point is checked.

For example, in the embodiment of FIG. 5, since the size of the charging and discharging interruption time (the time between T1 and T2) is smaller than the size of the reference time, the control unit 120 may check whether a voltage inflection point is present during the charging and discharging interruption time (the time between T1 and T2).

Here, the inflection point is a point at which a concave shape changes in a curve, which may generally refer to a point at which a curvature change from negative to positive or vice versa, in a plane curve. That is, the control unit 120 may determine whether there is an inflection point in which the voltage increase/decrease slope changes from positive to negative or from negative to positive by analyzing the voltage information obtained during the charging and discharging interruption time (the time between T1 to T2).

If it is checked that the voltage inflection point is present in the voltage information obtained during the charging and discharging interruption time (the time between T1 and T2), the control unit 120 may estimate the second SOC based on the voltage information obtained during the charging and discharging interruption time (the time between T1 and T2). In addition, the control unit 120 may estimate the third SOC based on the estimated first SOC and the estimated second SOC. That is, in this case, when the SOC of the battery cell 10 is estimated, both current and voltage of the battery cell 10 may be considered.

Conversely, if it is checked that no voltage inflection point is present in the voltage information obtained during the charging and discharging interruption time (the time between T1 and T2), the control unit 120 may estimate the third SOC based on the estimated first SOC. That is, in this case, the control unit 120 may not estimate the second SOC based on the obtained voltage information, but may estimate the estimated first SOC as the third SOC. That is, in this case, when the SOC of the battery cell 10 is estimated, only the current of the battery cell 10 may be considered.

The factors considered by the control unit 120 when estimating the third SOC are summarized in Table 1 below.

TABLE 1

| sizes of the charging and discharging interruption time and the reference time | whether a voltage inflection point is present | factors considered in estimating the third SOC |
|---|---|---|
| charging and discharging interruption time ≥ reference time | not considered | first SOC and second SOC |
| charging and discharging interruption time < reference time | voltage inflection point is present | first SOC and second SOC |
| | voltage inflection point is not present | first SOC |

Table 1 is a table that summarizes the factors considered when estimating the third SOC. Specifically, Table 1 is a table showing the factors necessary for estimating the third SOC according to the sizes of the charging and discharging interruption time and the reference time and according to whether a voltage inflection point is present in the voltage information obtained during the charging and discharging interruption time.

For example, referring to Table 1 and FIG. 4, if the size of the charging and discharging interruption time (the time between T1 and T2) is equal to or greater than the size of the reference time (the time between T1 and Tref), the control unit 120 may estimate the third SOC by considering both the first SOC and the second SOC regardless of whether a voltage inflection point is present.

As another example, referring to Table 1 and FIG. 5, if the size of the charging and discharging interruption time (the time between T1 and T2) is smaller than the size of the reference time (the time between T1 and Tref), the control unit 120 may configure the factor required for estimating the third SOC differently according to whether a voltage inflection point is present in the voltage information measured during the charging and discharging interruption time (the time between T1 and T2).

If no voltage inflection point is present in the voltage information measured during the charging and discharging interruption time (the time between T1 and T2), the control unit 120 may estimate the first SOC as the third SOC. Conversely, if a voltage inflection point is present in the voltage information measured during the charging and discharging interruption time (the time between T1 and T2), the control unit 120 may estimate the third SOC by considering both the first SOC and the second SOC.

In summary, the SOC estimating apparatus 100 according to an embodiment of the present disclosure has an advantage of estimating the SOC of the battery cell 10 to be optimized in each case in consideration of the size of the charging and discharging interruption time and the presence or absence of the voltage inflection point.

Therefore, according to the present disclosure, if the battery cell 10 is provided in a driving device such as an electric vehicle as well as a test device, namely in a situation where a sufficient rest period for estimating the SOC (especially, the second SOC) of the battery cell 10 is not guaranteed, the SOC of the battery cell 10 may be more accurately estimated.

Preferably, the reference time may be a time preset in consideration of the voltage polarization reverse effect of the battery cell 10.

That is, the control unit 120 may be configured to set the reference time in advance so that the time at which the polarization directions of a short-term polarization component and a long-term polarization component of the battery cell 10 become different from each other is included therein.

Here, the short-term polarization component and the long-term polarization component may be general terms that refer to voltage polarization components of the battery cell 10. Specifically, the short-term polarization component may be a polarization component that moves with respect to a large current for a short time, and may be a component designed for a characteristic of the battery cell 10 that rapidly changes when a large current is applied for a short time. In addition, the long-term polarization component may be a polarization component that is affected by current for a long time, and may be a component designed for a characteristic that the battery cell 10 changes from an activated state to a stable state.

That is, the control unit 120 may set the reference time to include a time interval from the time when charging or discharging of the battery cell 10 is completed to the time when the sign of the short-term polarization component and the sign of the long-term polarization component become different from each other. Here, the sign of the short-term polarization component and the sign of the long-term polarization component may become different from each other when the battery cell 10 enters the rest period after rapid charging or discharging occurs. That is, after rapid charging or discharging occurs, a voltage polarization reverse effect in which the sign of the short-term polarization component and the sign of the long-term polarization component become different from each other may occur in the battery cell 10.

For example, the time at which the sign of the short-term polarization component of the battery cell 10 and the sign of the long-term polarization component become different from each other may be a time when about 300 seconds passes from the time when charging or discharging of the battery cell 10 is finished. Accordingly, the control unit 120 may preset the reference time to 300 to 500 seconds, so that the time at which the polarization directions of the short-term polarization component and the long-term polarization component of the battery cell 10 become different from each other may be included within the reference time. Preferably, the reference time may be set to 300 seconds.

Hereinafter, voltage changes of the battery cell 10 will be described with reference to FIGS. 6 to 9, when the polarization directions of the short-term polarization component and the long-term polarization component of the battery cell 10 are identical to each other or different from each other.

Figure 6:
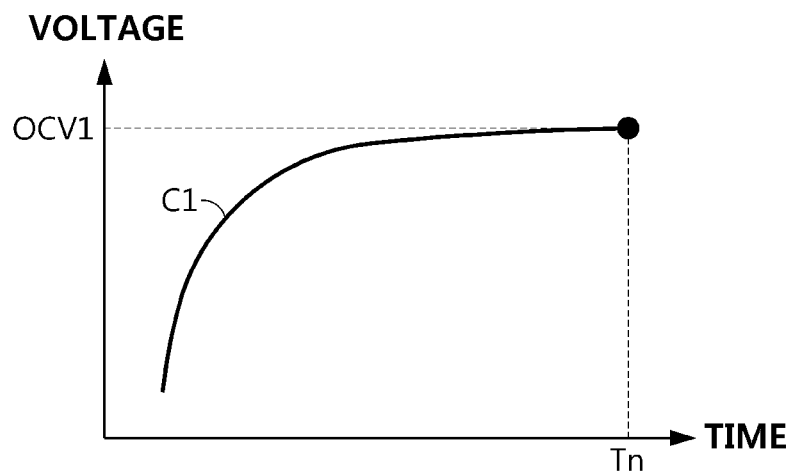
FIG. 6 is a diagram showing a first voltage rough graph of the battery cell after being completely discharged.
Figure 7:
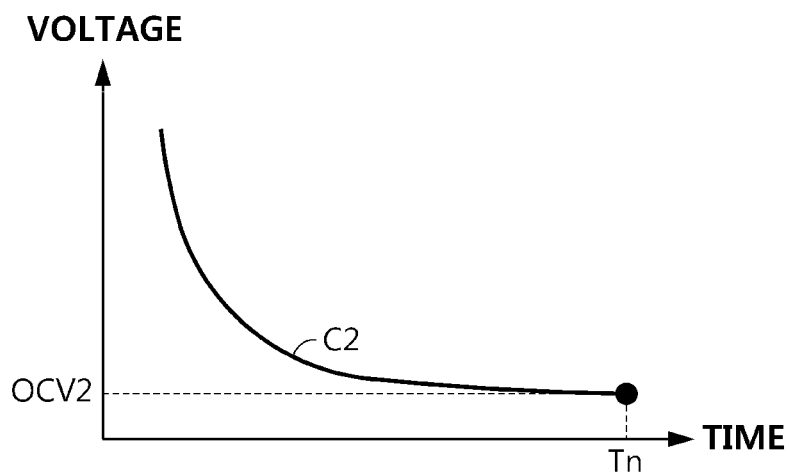
FIG. 7 is a diagram showing a second voltage rough graph of the battery cell after being completely charged.
Figure 8:
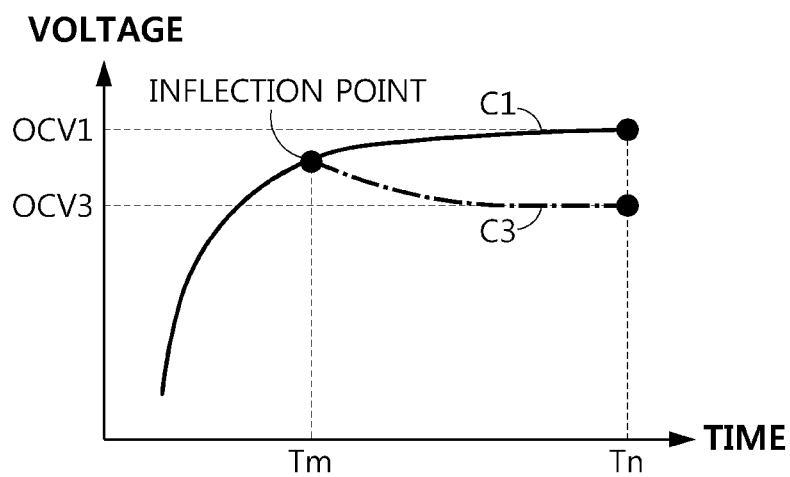
FIG. 8 is a diagram showing a third voltage rough graph of the battery cell after being completely discharged.
Figure 9:
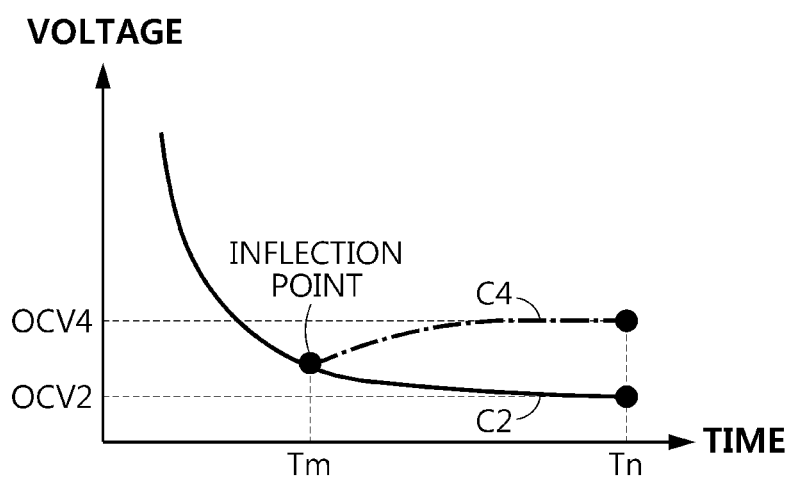
FIG. 9 is a diagram showing a fourth voltage rough graph of the battery cell after being completely charged.

FIG. 6 is a diagram showing a first voltage rough graph (C1) of the battery cell 10 after being completely discharged. FIG. 7 is a diagram showing a second voltage rough graph (C2) of the battery cell 10 after being completely charged. FIG. 8 is a diagram showing a third voltage rough graph (C3) of the battery cell 10 after being completely discharged. FIG. 9 is a diagram showing a fourth voltage rough graph (C4) of the battery cell 10 after being completely charged.

Specifically, FIGS. 6 and 7 are voltage rough graphs of the battery cell 10 in which the voltage polarization reverse effect does not occur, and FIGS. 8 and 9 are voltage rough graphs of the battery cell 10 in which the voltage polarization reverse effect occurs.

First, referring to FIG. 6, the OCV (Open Circuit Voltage) of the battery cell 10 completely discharged may be measured as OCV1 after a sufficient rest period passes. Meanwhile, referring to FIG. 8, the OCV of the battery cell 10 in which the voltage polarization reverse effect occurs may be measured as OCV3 after a sufficient rest period passes.

If the first voltage rough graph (C1) illustrated in FIG. 6 is compared with the third voltage rough graph (C3) illustrated in FIG. 8, a voltage inflection point may appear at a time Tm in the third voltage rough graph (C3). That is, in the third voltage rough graph (C3), the sign of the short-term polarization component and the sign of the long-term polarization component may be different at the time Tm. Therefore, after the time Tm, the first voltage rough graph (C1) maintains a positive slope, but the third voltage rough graph (C3) may be changed from a positive slope to a negative slope.

In addition, referring to FIG. 7, the OCV of the battery cell 10 completely charged may be measured as OCV2 after a sufficient rest period passes. Meanwhile, referring to FIG. 9, the OCV of the battery cell 10 in which the voltage polarization reverse effect occurs may be measured as OCV4 after a sufficient rest period passes.

If the second voltage rough graph (C2) illustrated in FIG. 7 is compared with the fourth voltage rough graph (C4) illustrated in FIG. 9, a voltage inflection point may appear at the time Tm in the fourth voltage rough graph (C4). That is, in the fourth voltage rough graph (C4), the sign of the short-term polarization component and the sign of the long-term polarization component may be different at the time Tm. Therefore, after the time Tm, the second voltage rough graph (C2) maintains a negative slope, but the fourth voltage rough graph (C4) may be changed from a negative slope to a positive slope.

In addition, since OCV and SOC correspond to each other in a one-to-one relationship, the second SOC estimated based on OCV1 and the SOC estimated based on OCV3 may be different greatly. In addition, the second SOC estimated based on OCV2 and the SOC estimated based on OCV4 may also be different greatly. That is, depending on whether a voltage inflection point occurs, the estimated OCV and SOC may be changed.

Referring to FIGS. 6 to 9, in the battery cell 10 in which a voltage polarization reverse effect occurs, a voltage inflection point may occur after charging or discharging is finished. That is, the SOC estimating apparatus 100 according to an embodiment of the present disclosure may accurately estimate the OCV of the battery cell 10 in consideration of the voltage polarization reverse effect by setting the reference time to be equal to or greater than a time at which the voltage inflection point may occur.

In addition, the SOC estimating apparatus 100 may more accurately estimate the second SOC of the battery cell 10 in consideration of the voltage polarization reverse effect.

In addition, the SOC estimating apparatus 100 may accurately estimate the final SOC of the battery cell 10 based on the more accurately estimated second SOC.

The control unit 120 may be configured to estimate the OCV of the battery cell 10 from a plurality of voltage information received during the charging and discharging interruption time by using a function optimization technique.

Here, the function optimization technique may be a curve customized analysis technique that analyzes an equation of a curve based on given data. In other words, the function optimization technique used in the present disclosure is a technique that not only linearly interprets the given data, but also estimates a curve by the given data to derive a final result. For example, a Levenberg-Marquardt algorithm or Extended Kalman Filter may be applied to the function optimization technique.

As a specific example, a case where the Levenberg-Marquardt algorithm is applied as the function optimization technique will be described. The control unit 120 may obtain a first time constant, a second time constant, a first voltage value, a second voltage value, and an OCV from the Levenberg-Marquardt algorithm based on an R-C equivalent circuit model having two RC parallel circuits. The OCV obtained herein may be estimated as the SOC of the battery cell 10. That is, the control unit 120 may estimate the OCV of the battery cell 10 by using the plurality of voltage information measured during the charging and discharging interruption time as input data of the function optimization technique. Here, since the R-C equivalent circuit model and the Levenberg-Marquardt algorithm having two RC parallel circuits are known model and algorithm, detailed descriptions thereof will be omitted.

Referring to FIGS. 8 and 9, if the sign of the short-term polarization component of the battery cell 10 and the sign of the long-term component become different from each other, a voltage inflection point may be included in the plurality of voltage information obtained by the control unit 120. Therefore, the control unit 120 may estimate the OCV of the battery cell 10 as OCV3 or OCV4 using the function optimization technique.

It is assumed that the reference time is set without considering the voltage inflection point. That is, in the embodiments of FIGS. 8 and 9, it is assumed that only voltage information up to the time Tm is obtained. In this case, by using the function optimization technique, the OCV of the battery cell 10 may be estimated based on little voltage information. However, even if the function optimization technique, which is a curve customization technique, is used, since there is no voltage information for the voltage inflection point, the voltage rough graph of the battery cell 10 is inevitably estimated as the first voltage rough graph (C1) or the second voltage rough graph (C2). Therefore, the OCV of the battery cell 10 has no choice but to be incorrectly estimated as OCV1 or OCV2. After all, due to the wrong estimation of OCV, the second SOC of the battery cell 10 is also inevitably estimated erroneously.

Meanwhile, the SOC estimating apparatus 100 according to an embodiment of the present disclosure has an advantage of setting the reference time in consideration of the possibility of occurrence of a voltage polarization reverse effect in order to secure sufficient voltage information for the battery cell 10. Therefore, there is an advantage that OCV and SOC of the battery cell 10 may be more accurately estimated.

In addition, the charging and discharging interruption time may be significantly shorter than the idle time for measuring the OCV of the battery cell 10. For example, the reference time may be set to 300 seconds, and the idle time for measuring the OCV of the battery cell 10 may be 3 hours. Therefore, the SOC estimating apparatus 100 according to an embodiment of the present disclosure has an advantage of accurately estimating the OCV of the battery cell 10 based on the voltage information of the battery cell 10 even in an environment where it is difficult to secure a sufficient idle time. In addition, the SOC estimating apparatus 100 has an advantage of accurately estimating the SOC of the battery cell 10 within a short time based on the estimated OCV and the current information of the battery cell 10.

In addition, referring to Table 1 and FIGS. 5 and 8, if the discharging of the battery cell 10 is restarted before the reference time passes immediately after the discharging of the battery cell 10 is finished, the control unit 120 may check first whether the voltage inflection point is included in the obtained voltage information.

For example, in the embodiments of FIGS. 5 and 8, it is assumed that the time Tm is earlier than the time Tref. In addition, it is assumed that the time T2 is later than the time Tm and earlier than the time Tref. If the data on the voltage inflection point is included in the plurality of voltage information obtained during the time between T1 and T2, the control unit 120 may estimate the OCV of the battery cell 10 based on the plurality of obtained voltage information using a function customization technique. That is, since the voltage inflection point information is included in the obtained voltage information, the control unit 120 may estimate the OCV of the battery cell 10 as OCV3 instead of OCV1. After that, the control unit 120 may estimate the second SOC based on the estimated OCV3.

That is, as long as the voltage inflection point is included in the voltage information obtained during the charging and discharging interruption time, the SOC estimating apparatus 100 according to an embodiment of the present disclosure may estimate the second SOC based on the obtained voltage information even if the charging and discharging interruption time is shorter than the reference time. Therefore, based on the first SOC and the second SOC, the final SOC of the battery cell 10 may be more accurately estimated.

The control unit 120 may be configured to set a first weight and a second weight according to the charging and discharging interruption time.

That is, the control unit 120 may be configured to set the first weight and the second weight, respectively, based on the size of the charging and discharging interruption time. Preferably, the sum of the first weight and the second weight may be 1.

In addition, the control unit 120 may be configured to add the set first weight and the set second weight to the first SOC and the second SOC, respectively.

Specifically, the control unit 120 may add the first weight to the first SOC and add the second weight to the second SOC.

For example, it is assumed that the first weight is 0.3 and the second weight is 0.7. In addition, it is assumed that the first SOC is estimated as 80% and the second SOC is estimated as 82%. The control unit 120 may calculate 24% by multiplying the first weight of 0.3 and the first SOC of 80%. In addition, the control unit 120 may calculate 57.4% by multiplying the second weight of 0.7 and the second SOC of 82%.

After that, the control unit 120 may be configured to estimate the third SOC by summing the weighted first SOC and the weighted second SOC.

Referring to the former embodiment, the first SOC to which the first weight is added may be 24%, and the second SOC to which the second weight is added may be 57.4%. The control unit 120 may estimate the third SOC as 81.4% by summing the weighted first SOC of 24% and the weighted second SOC of 57.4%.

In addition, the control unit 120 may estimate the estimated third SOC as the final SOC of the battery cell 10.

That is, the SOC estimating apparatus 100 according to an embodiment of the present disclosure has an advantage of more accurately estimating the SOC of the battery cell 10 in consideration of the weights of the charging and discharging time and the charging and discharging interruption time of the battery cell 10.

Preferably, the control unit 120 may be configured to set the charging interruption time and the first weight to be inversely proportional to each other and set the charging interruption time and the second weight to be proportional to each other.

Specifically, the control unit 120 may set the first weight using Equation 1 below.

$$\alpha = e^{-(Trest+5)}$$ [Equation 1]

In Equation 1, Trest may be a charging and discharging interruption time, and e may be a natural constant.

Referring to Equation 1, the first weight may be set in inverse proportion to the charging and discharging interruption time. That is, since the first weight is added to the first SOC, the first weight may be set in inverse proportion to the charging and discharging interruption time.

After that, the control unit 120 may set the second weight using Equation 2 below.

$$\beta = 1 - \alpha$$ [Equation 2]

In Equation 2, $\alpha$ is the first weight and $\beta$ is the second weight. That is, the sum of the first weight and the second weight may be 1.

Referring to Equation 2, the second weight may be set in proportion to the charging and discharging interruption time.

That is, the control unit 120 may increase the weight of the second SOC in the third SOC by setting the second weight greater as the charging and discharging interruption time increases.

That is, the SOC estimating apparatus 100 according to an embodiment of the present disclosure has an advantage of more adaptively estimating the SOC of the battery cell 10 by differentially adding a weight according to the charging and discharging interruption time.

The SOC estimating apparatus 100 according to the present disclosure may be applied to a battery management system (BMS). That is, the BMS according to the present disclosure may include the SOC estimating apparatus 100 described above. In this configuration, at least some of components of the SOC estimating apparatus 100 may be implemented by supplementing or adding functions of the components included in a conventional BMS. For example, the measuring unit 110, the control unit 120 and the storage unit 130 of the SOC estimating apparatus 100 may be implemented as components of the BMS.

In addition, the SOC estimating apparatus 100 according to an embodiment of the present disclosure may be provided to a battery pack 1. For example, referring to FIGS. 2 and 3, the battery pack 1 according to the present disclosure may include the above-described SOC estimating apparatus 100 and one or more battery cells 10. In addition, the battery pack 1 may further include electrical components (a relay, a fuse and the like) and a case.

In addition, the SOC estimating apparatus 100 according to an embodiment of the present disclosure may be included in a vehicle. Preferably, the battery pack 1 including the SOC estimating apparatus 100 according to an embodiment of the present disclosure may be included in an electric vehicle. In this case, the time during which the battery cell 10 is charged or the time during which the electric vehicle is operated may correspond to the charging and discharging time. Conversely, the time when the electric vehicle is turned off may correspond to the charging and discharging interruption time.

For example, as in the former embodiment, it is assumed that the reference time is set to 300 seconds and the preferred idle time for measuring the OCV of the battery cell 10 is 3 hours. In this case, when charging/discharging is interrupted for 300 seconds or more, the control unit 120 may accurately estimate the OCV of the battery cell 10 based on the plurality of obtained voltage information. That is, the control unit 120 may estimate the OCV and the second SOC of the battery cell 10 based on the voltage information obtained during the reference time (300 seconds), without waiting for the desired idle time (3 hours) after the electric vehicle is turned off. Therefore, even in an electric vehicle environment where it is difficult to secure a sufficient idle time for measuring the OCV, the SOC estimating apparatus 100 according to an embodiment of the present disclosure has an advantage of estimating the SOC accurately and quickly.

Figure 10:
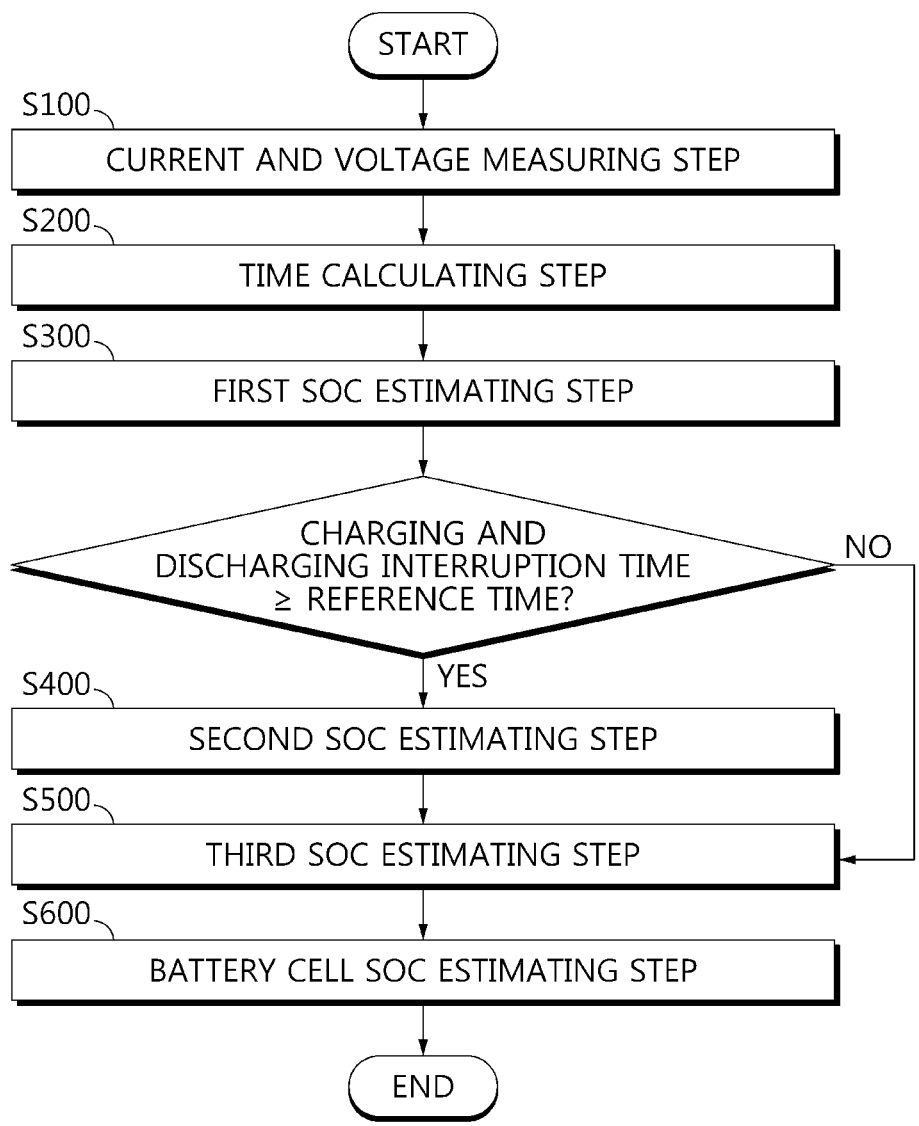
FIG. 10 is a diagram schematically showing a SOC estimating method according to another embodiment of the present disclosure.

FIG. 10 is a diagram schematically showing a SOC estimating method according to another embodiment of the present disclosure. Here, the SOC estimating method may be performed by each component of the SOC estimating apparatus 100.

Referring to FIG. 10, the SOC estimating method may include a current and voltage measuring step (S100), a time calculating step (S200), a first SOC estimating step (S300), a second SOC estimating step (S400), a third SOC estimating step (S500), and a battery cell SOC estimating step (S600).

Here, the first SOC may be a SOC estimated based on the current information of the battery cell 10 measured during the charging and discharging time, and the second SOC may be a SOC estimated based on the voltage information of the battery cell 10 measured during the charging and discharging interruption time. In addition, the third SOC may be a SOC obtained by performing a weighted summation to the first SOC and the second SOC, and the SOC of the battery cell 10 may be a SOC finally estimated based on the third SOC.

The current and voltage measuring step (S100) is a step of measuring a current and voltage of the battery cell 10 to obtain current information and voltage information, and may be performed by the measuring unit 110.

Specifically, the measuring unit 110 may measure the voltage of the battery cell 10 through the voltage measuring unit 111 and measure the current of the battery cell 10 through the current measuring unit 112.

In addition, the measuring unit 110 may output the measured current information and the measured voltage information to the control unit 120, and the control unit 120 may obtain the current information and the voltage information.

The time calculating step (S200) is a step of calculating a charging and discharging time at which the battery cell 10 is charged or discharged or a charging and discharging interruption time at which the charging or discharging is interrupted, and may be performed by the control unit 120.

For example, the control unit 120 may determine whether the battery cell 10 is being charged or discharged based on the current information received from the measuring unit 110. In addition, the charging and discharging time and the charging and discharging interruption time may be calculated based on the determination result.

The first SOC estimating step (S300) is a step of estimating a first SOC of the battery cell 10 according to the current information during the charging and discharging time, and may be performed by the control unit 120.

For example, the control unit 120 may estimate the first SOC by extracting a current amount from the current information obtained during the charging and discharging time and integrating the extracted current amount.

The second SOC estimating step (S400) is a step of estimating the second SOC of the battery cell 10 according to the voltage information based on the comparison result of the charging and discharging interruption time and the preset reference time, and may be performed by the control unit 120.

For example, referring to Table 1, if the charging and discharging interruption time is greater than or equal to the preset reference time, the control unit 120 may estimate the second SOC based on a plurality of voltage information received from the measuring unit 110 during the charging and discharging interruption time.

Specifically, the control unit 120 may estimate an OCV from the plurality of received voltage information using a function optimization technique. In addition, the control unit 120 may estimate the second SOC from the estimated OCV by referring to an OCV-SOC look-up table stored in the storage unit 130.

The third SOC estimating step (S500) is a step of estimating a third SOC by performing a weighted summation to the first SOC and the second SOC based on the charging and discharging interruption time, and may be performed by the control unit 120.

The control unit 120 may set a first weight and a second weight by using Equation 1 and Equation 2. In addition, the control unit 120 may add the first weight to the first SOC and add the second weight to the second SOC. After that, the control unit 120 may estimate the third SOC by summing the weighted first SOC and the weighted second SOC.

The battery cell SOC estimating step (S600) is a step of determining the estimated third SOC as the SOC of the battery cell 10, and may be performed by the control unit 120.

The control unit 120 may determine the estimated third SOC as the final SOC of the battery cell 10.

That is, since the final SOC of the battery cell 10 is estimated by considering both the current information measured during the charging and discharging time and the voltage information measured during the charging and discharging interruption time, the estimated SOC may be environmentally adaptive and more accurate.

FIG. 11 is a diagram schematically showing a SOC estimating method according to still another embodiment of the present disclosure. The SOC estimating method according to FIG. 11 may be performed by the SOC estimating apparatus 100 according to an embodiment of the present disclosure.

Hereinafter, only an added step will be described, excluding redundant descriptions of the steps described with reference to FIG. 10.

Referring to FIG. 11, the SOC estimating method according to another embodiment of the present disclosure may further include an inflection point checking step (S700).

The inflection point checking step (S700) is a step of checking whether a voltage inflection point is present among the plurality of voltage information obtained during the charging and discharging interruption time, if the charging and discharging interruption time is smaller than the reference time, and may be performed by the control unit 120.

For example, referring to FIG. 11 and Table 1, if a voltage inflection point exists, the control unit 120 may estimate the second SOC even if the size of the charging and discharging interruption time is smaller than the size of the reference time. Conversely, if no voltage inflection point exists, the control unit 120 may estimate the estimated first SOC as the third SOC without estimating the second SOC.

Therefore, the final SOC of the battery cell 10 may be more accurately estimated according to the size of the charging and discharging interruption time and the presence or absence of the voltage inflection point.

The embodiments of the present disclosure described above may not be implemented only through an apparatus and method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

In addition, since the present disclosure described above can be substituted, modified and changed in various ways by those skilled in the art without departing from the technical idea of the present disclosure, the present disclosure is not limited by the embodiments described above and the accompanying drawings, and all or some of the embodiments may be selectively combined to enable various modifications.

EXPLANATION OF REFERENCE SIGNS

1: battery pack
10: battery cell
100: SOC estimating apparatus
110: measuring unit
120: control unit
130: storage unit
SL1 to SL3: first to third sensing lines

What is claimed is:

1. A state of charge (SOC) estimating apparatus, comprising:
   a measuring unit configured to:
      measure a current and voltage of a battery cell; and
      output the measured current information and the measured voltage information; and
   a control unit configured to:
      receive the current information and the voltage information from the measuring unit;
      calculate:
         a charging and discharging time during which the battery cell is charged or discharged and
         a charging and discharging interruption time during which the charging and discharging is interrupted;
      estimate a first SOC of the battery cell according to the current information during the charging and discharging time;
      determine whether or not to estimate a second SOC of the battery cell according to the voltage information,. based on a comparison result of the charging and discharging interruption time and a preset reference time;
      estimate a third SOC by performing a weighted summation to the first SOC and the second SOC, based on the charging and discharging interruption time when the second SOC is estimated; and
      determine the estimated third SOC as the SOC of the battery cell.

2. The SOC estimating apparatus according to claim 1, wherein, when the charging and discharging interruption time is greater than or equal to the reference time, the control unit is further configured to estimate the second SOC based on a plurality of voltage information received during the charging and discharging interruption time.

3. The SOC estimating apparatus according to claim 2, wherein, when the charging and discharging interruption time is smaller than the reference time, the control unit is further configured to:
   check whether a voltage inflection point is present in the plurality of voltage information received during the charging and discharging interruption time; and
   estimate the second SOC only when the voltage inflection point is checked.

4. The SOC estimating apparatus according to claim 1, wherein the control unit is further configured to set the reference time in advance so that a time at which polarization directions of a short-term polarization component and a long-term polarization component of the battery cell become different from each other is included in the reference time.

5. The SOC estimating apparatus according to claim 4, wherein the control unit is further configured to estimate an open circuit voltage (OCV) of the battery cell from the plurality of voltage information received during the charging and discharging interruption time by using a function optimization technique.

6. The SOC estimating apparatus according to claim 5, wherein the control unit is further configured to estimate a second SOC corresponding to the estimated OCV, based on a preset look-up table.

7. The SOC estimating apparatus according to claim 1, wherein the control unit is further configured to:
   set a first weight and a second weight according to the charging and discharging interruption time;
   add the set first weight and the set second weight to the first SOC and the second SOC, respectively; and
   estimate the third SOC by summing the weighted first SOC and the weighted second SOC.

8. The SOC estimating apparatus according to claim 7, wherein the control unit is further configured to:
   set the charging and discharging interruption time and the first weight to be inversely proportional to each otheri and
   set the charging and discharging interruption time and the second weight to be proportional to each other.

9. A battery pack, comprising the SOC estimating apparatus according to claim 1.

10. A vehicle, comprising the SOC estimating apparatus according to claim 1.

11. A state of charge (SOC) estimating method, comprising:
   a current and voltage measuring operation of measuring a current and voltage of a battery cell to obtain current information and voltage information;
   a time calculating operation of calculating:
      a charging and discharging time during which the battery cell is charged or discharged; and
      a charging and discharging interruption time during which the charging and discharging is interrupted;
   a first SOC estimating operation of estimating a first SOC of the battery cell according to the current information during the charging and discharging time;
   a second SOC estimating operation of estimating a second SOC of the battery cell according to the voltage information,. based on a comparison result of the charging and discharging interruption time and a preset reference time;
   a third SOC estimating operation of estimating a third SOC by performing a weighted summation to the first SOC and the second SOC, based on the charging and discharging interruption time; and
   a battery cell SOC estimating operation of determining the estimated third SOC as the SOC of the battery cell.

12. The SOC estimating method according to claim 11, further comprising, after the first SOC estimating operation:
   an inflection point checking operation of checking whether a voltage inflection point is present in a plurality of voltage information received during the charging and discharging interruption time, when the charging and discharging interruption time is smaller than the reference time,
   wherein the second SOC estimating operation estimates the second SOC only when:
      the charging and discharging interruption time is greater than or equal to the reference time, or
      the voltage inflection point is checked in the inflection point checking operation.

* * * * *